(12) United States Patent
Wong et al.

(10) Patent No.: US 7,491,607 B2
(45) Date of Patent: Feb. 17, 2009

(54) METHOD OF FABRICATING FLASH MEMORY CELL

(75) Inventors: Wei-Zhe Wong, Tainan (TW); Ching-Sung Yang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/750,320

(22) Filed: May 17, 2007

(65) Prior Publication Data
US 2007/0218634 A1  Sep. 20, 2007

Related U.S. Application Data

(62) Division of application No. 10/904,749, filed on Nov. 25, 2004, now Pat. No. 7,235,839.

(30) Foreign Application Priority Data
Aug. 2, 2004  (TW) .................. 93123057 A

(51) Int. Cl.
*H01L 21/336* (2006.01)
(52) U.S. Cl. .................... 438/257; 438/258
(58) Field of Classification Search ........ 438/257, 438/258
See application file for complete search history.

(56) References Cited

U.S. PATENT DOCUMENTS

| | | | | |
|---|---|---|---|---|
| 5,455,792 A | * | 10/1995 | Yi | 365/185.15 |
| 5,912,488 A | * | 6/1999 | Kim et al. | 257/316 |
| 5,991,204 A | * | 11/1999 | Chang | 365/185.29 |
| 6,091,104 A | * | 7/2000 | Chen | 257/326 |
| 6,584,018 B2 | * | 6/2003 | Tuan et al. | 365/185.28 |

* cited by examiner

Primary Examiner—Douglas M Menz
(74) Attorney, Agent, or Firm—Jianq Chyun IP Office

(57) ABSTRACT

A flash memory cell is provided. A deep well is disposed in a substrate and a well is disposed within the deep well. A stacked gate structure is disposed on the substrate. A source region and a drain region are disposed in the substrate on each side of the stacked gate structure. A select gate is disposed between the stacked gate structure and the source region. A first gate dielectric layer is disposed between the select gate and the stacked gate structure. A second gate dielectric layer is disposed between the select gate and the substrate. A shallow doped region is disposed in the substrate under the stacked gate structure and the select gate. A deep doped region is disposed in the substrate on one side of the stacked gate structure. The conductive plug on the substrate extends through the drain region and the deep doped region.

7 Claims, 4 Drawing Sheets

METHOD OF FABRICATING FLASH MEMORY CELL

CROSS-REFERENCE TO RELATED APPLICATION

This application is a divisional application of a patent application Ser. No. 10/904,749, filed Nov. 25, 2004, now allowed, which claims the priority benefit of Taiwan application serial no. 93123057, filed on Aug. 2, 2004. The entirety of each of the above-mentioned patent applications is hereby incorporated by reference herein and made a part of this specification.

BACKGROUND OF THE INVENTION

1. Field of the Invention

The present invention relates to a non-volatile memory and fabricating method thereof. More particularly, the present invention relates to a flash memory cell and fabricating method thereof.

2. Description of the Related Art

Flash memory is a type of non-volatile memory that allows multiple data writing, reading and erasing operations. The stored data will be retained even after power to the device is removed. With these advantages, flash memory has become one of the most widely adopted non-volatile memories for personal computer and electronic equipment.

A typical flash memory has a floating gate and a control gate fabricated using doped polysilicon. To program data into or erase data from a flash memory cell, an appropriate bias voltage is applied to the source region, the drain region and the control gate respectively so that electrons are injected into the floating gate or withdrawn from the floating gate. The most common mode for injecting electrons into a flash memory cell includes the channel hot-electron injection (CHEI) mode and the Fowler-Nordheim tunneling mode. In general, the types of programming and erasing operations carried out on the memory devices depend on the ways the electrons are injected or pulled out.

FIG. 1 is a schematic cross-sectional view showing a single memory cell of a conventional flash memory. The flash memory cell mainly includes an n-type substrate 100, a deep p-type well 102, an n-type well 104, a stacked gate structure 106, an n-type source region 108a, an n-type drain region 108b, a p-type shallow doped region 109, a p-type deep doped region 110 and a conductive plug 112. The deep p-type well 102 is disposed in the substrate 100 and the n-type well 104 is disposed within the deep p-type well 102. The stacked gate structure 106 is disposed on the substrate 100. The stacked gate structure 106 includes a tunneling layer 114, a floating gate 116, a gate dielectric layer 118 and a control gate 120 sequentially stacked over the substrate 100. The n-type source region 108a and the n-type drain region 108b are disposed in the n-type well 104 and the p-type deep doped region 110 on each side of the stacked gate structure 106. The p-type shallow doped region 109 is disposed in the n-type well 104 underneath the stacked gate structure 106. The p-type deep doped region 110 is disposed within the n-type well 104 on one side of the stacked gate structure 106 but adjacent to the p-type shallow doped region 109. The conductive plug 112 in the substrate 100 extends downward to pass through the n-type drain region 108b and connect with a portion of the p-type deep doped region 110.

To program data into the aforementioned flash memory cell, a bias voltage is applied to the source region, the drain region and the control gate respectively. However, the control gate and the source region of the memory cell are also connected to the control gate and the source region of a neighboring memory cell. That is, two memory cells share a common word line and source line. Consequently, a voltage applied to select one particular memory cell may interfere with other non-selected memory cells on the same word line leading to reliability problems in the memory devices.

In addition, the disposition of the control gate and the source region close to each other may increase the probability of having a leaky device when a flash memory cell is programmed.

Furthermore, the aforementioned programming operation may cause the flash memory cell to be over-programmed, thereby leading to subsequent read-out problems. Due to the restriction imposed by the over-programming problems, the operable threshold voltage range of the device is severely compressed. In other words, the flash memory cell is limited to the storage of a single data bit.

SUMMARY OF THE INVENTION

Accordingly, at least one objective of the present invention is to provide a flash memory cell capable of reducing the effect of a voltage applied to a flash memory cell from affecting a neighboring memory cell in a flash memory cell programming operation.

At least a second objective of the present invention is to provide a method of fabricating and operating a flash memory cell capable of improving the reliability of the device.

To achieve these and other advantages and in accordance with the purpose of the invention, as embodied and broadly described herein, the invention provides a flash memory cell. The flash memory cell includes a first conductive type deep well, a second conductive type well, a stacked gate structure, a second conductive type source region, a second conductive type drain region, a select gate, a first gate dielectric layer, a second gate dielectric layer, a first conductive type shallow doped region, a first conductive type deep doped region and a conductive plug. The first conductive type deep well is disposed in the substrate and the second conductive type well is disposed within the first conductive type deep well. The stacked gate structure is disposed on the substrate. The stacked gate structure includes a tunneling layer, a floating gate, an inter-gate dielectric layer and a control gate sequentially stacked over the substrate. The second conductive type source region and the second conductive type drain region are disposed in the substrate on each side of the stacked gate structure. The select gate is disposed between the stacked gate structure and the second conductive type source region. The first gate dielectric layer is disposed between the select gate and the stacked gate structure. The second gate dielectric layer is disposed between the select gate and the substrate. The first conductive type shallow doped region is disposed in the second conductive type well underneath the stacked gate structure and the select gate. The second conductive type source region is disposed in the first conductive type shallow doped region. The first conductive type deep doped region is disposed in the second conductive type well on one side of the stacked gate structure but adjacent to the first conductive type shallow doped region. The second conductive type drain region is disposed in the first conductive type deep doped region. The conductive plug is disposed within the substrate. The conductive plug extends downward to pass through the second conductive type drain region and ends up with a portion inside the first conductive type deep doped region.

Because a select gate is deployed in the flash memory cell of the present invention, problems due to device leakage or over-programming in a conventional programming operation are effectively eliminated. Furthermore, programming a flash memory cell will no longer affect a neighboring flash memory cell. Hence, overall reliability of the memory device is improved. In addition, each flash memory cell can be used as a multi-bit storage cell.

The present invention also provides a method of fabricating a flash memory cell. First, a second conductive type deep well is formed in a first conductive type substrate and then a first conductive type well is formed in the second conductive type deep well. Thereafter, a second conductive type shallow doped region is formed in the first conductive type well. The shallow doped well is adjacent to the surface of the substrate. Next, a stacked gate structure is formed over the substrate. The stacked gate structure includes a tunneling layer, a floating gate, an inter-gate dielectric layer and a control gate sequentially formed over the substrate. A gate dielectric layer is formed between the stacked gate structure and the substrate. After that, a select gate is formed on one sidewall of the stacked gate structure. A deep doped region is formed in the substrate on the other side of the stacked gate structure. The deep doped region and the shallow doped region are adjacent to each other. Thereafter, a source region and a drain region are formed on each side of the select gate and the stacked gate structure respectively. The source region is formed in the substrate on one side of the select gate and the drain region is formed in the substrate on one side of the stacked gate structure. A dielectric layer is formed over the substrate to cover the stacked gate structure and the substrate. A contact opening is formed in the dielectric layer to expose a portion of the drain region and the deep doped region. Finally, a conductive plug is formed in the contact opening.

Because a select gate is deployed in the flash memory cell of the present invention, problems due to device leakage or over-programming in a conventional programming operation are effectively eliminated. Furthermore, the processes for forming the memory cell according to the present invention are compatible with the convention fabricating method. Hence, there is no need to purchase special equipment.

The present invention also provides a method of operating a flash memory cell. The operating method is suitable for operating the aforementioned flash memory cell. The operating method includes the following rules. To program data into the flash memory cell, a first positive voltage is applied to the source region and the drain region, a first negative voltage is applied to the control gate. Both the select gate and the first conductive type deep well are set to 0V. To erase data from the flash memory cell, a second positive voltage is applied to the control gate and a second negative voltage is applied to the source region and the first conductive type deep well. The drain region is maintained in a floating state and the select gate is set to 0V. To read data from the flash memory cell, a third positive voltage is applied to the source region and a fourth positive voltage is applied to the control gate and the select gate. The first conductive type deep well is set to 0V.

Because of the select gate inside the flash memory cell of the present invention, problems due to device leakage or over-programming in a conventional programming operation are effectively eliminated. Furthermore, programming a flash memory cell will no longer affect a neighboring flash memory cell. Hence, overall reliability of the memory device is improved. In addition, each flash memory cell can be used as a multi-bit storage cell.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
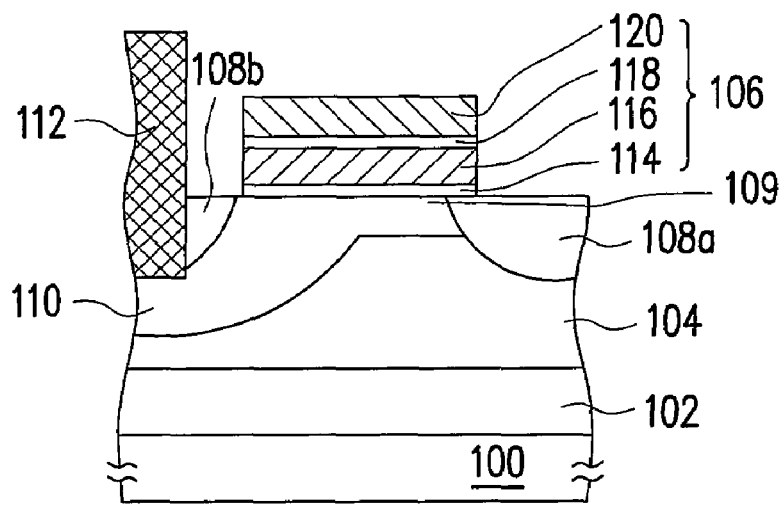
FIG. 1 is a schematic cross-sectional view showing a single memory cell of a conventional flash memory.

Reference will now be made in detail to the present preferred embodiments of the invention, examples of which are illustrated in the accompanying drawings. Wherever possible, the same reference numbers are used in the drawings and the description to refer to the same or like parts.

In the following embodiment, the first conductive type is in an n-doped state and the second conductive type is in a p-doped stage. However, anyone familiar with the technique may interchange the doping conditions said above. In the following, only one set of dopant types is described in detail. In addition, a NOR type flash memory cell array having common source region is used in the following description.

Figure 2A:
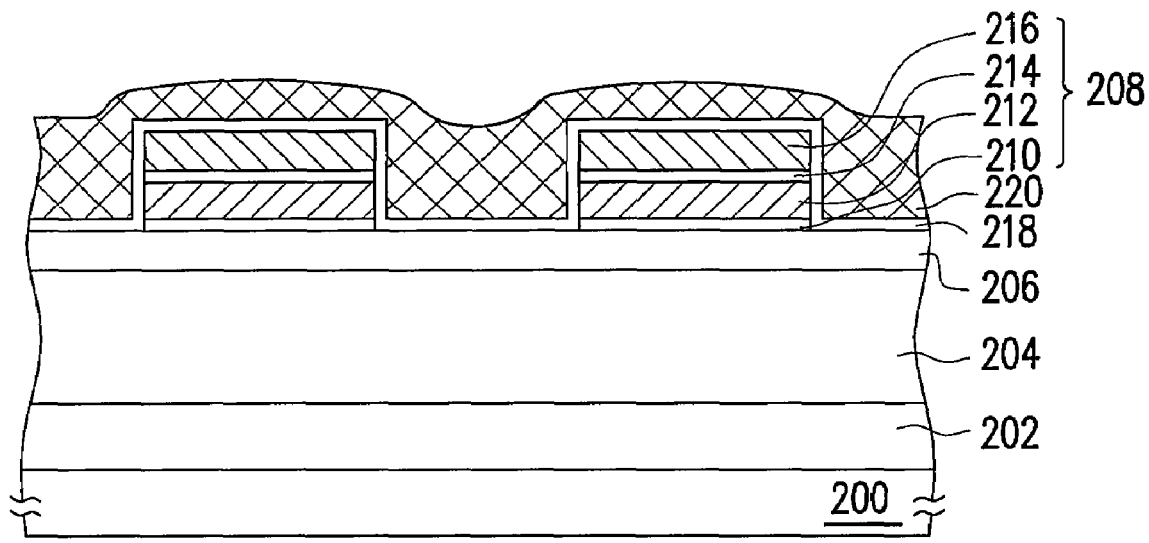
FIGS. 2A through 2C are schematic cross-sectional views showing the steps for fabricating a flash memory cell according to one preferred embodiment of the present invention.
Figure 2B:
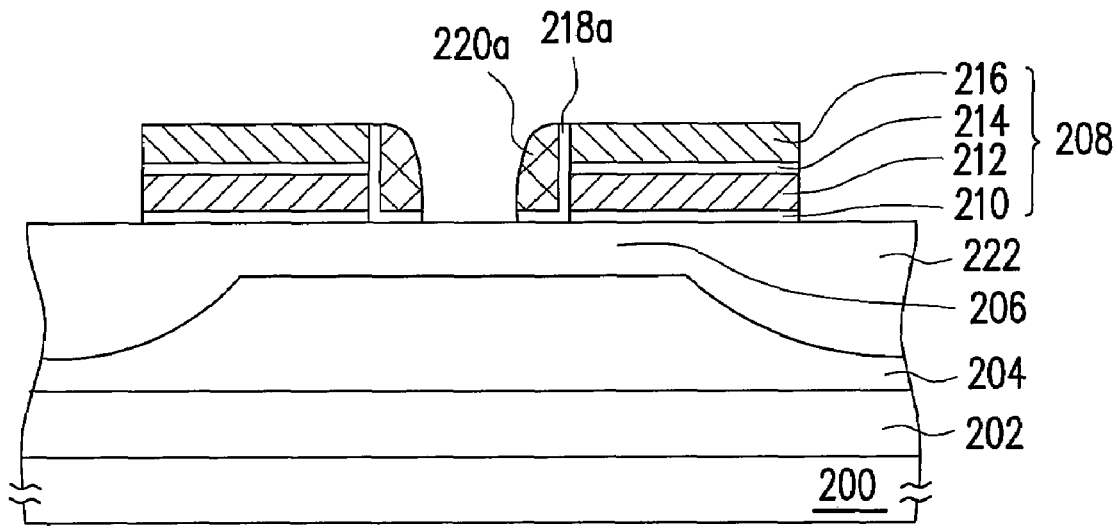
Figure 2C:
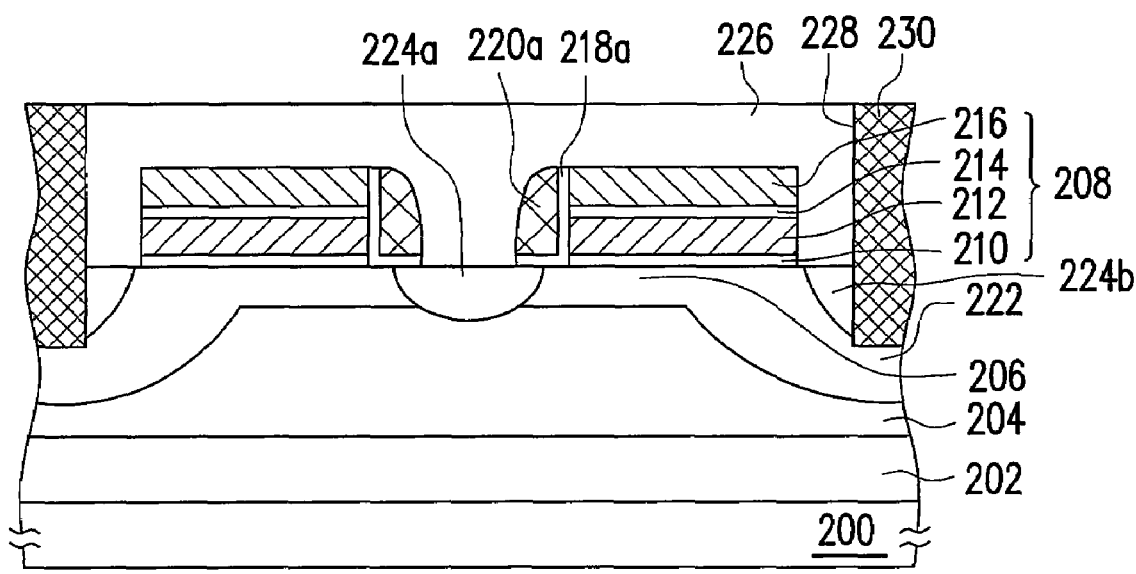

FIGS. 2A through 2C are schematic cross-sectional views showing the steps for fabricating a flash memory cell according to one preferred embodiment of the present invention. As shown in FIG. 2A, a substrate 200 such as an n-type substrate is provided and then a p-type deep well 202 is formed in the substrate 200. Thereafter, an n-type well 204 is formed within the p-type deep well 202. A p-type shallow doped region 206 is formed in the n-type well 204 adjacent to the substrate 200. The p-type deep well 202, the n-type well 204 and the p-type shallow doped region 206 are formed, for example, by performing an ion implantation.

Thereafter, a stacked gate structure 208 is formed over the substrate 200. The stacked gate structure 208 includes a tunneling layer 210, a floating gate 212, an inter-gate dielectric layer 214 and a control gate 216 sequentially formed over the substrate 200. The stacked gate structure 208 is formed, for example, by sequentially forming a tunneling material layer (not shown), a floating gate material layer (not shown), an inter-gate dielectric material layer (not shown) and a control gate material layer (not shown) over the substrate 200 and then performing a photolithographic and etching process. The floating gate and the control gate are fabricated using doped polysilicon, for example. Since the process and related parameters for forming the stacked gate structure 208 should be familiar to those skilled in the art of semiconductor production, a detail description of these steps is omitted.

Thereafter, a gate dielectric layer 218 is formed between the stacked gate structure 208 and the substrate 200. The gate dielectric layer 218 is a silicon oxide layer formed by performing a chemical vapor deposition process, for example. After that, a conductive material layer 220 is formed over the gate dielectric layer 218. The conductive material layer 220 is a doped polysilicon layer or other suitable conductive material layer formed by performing a chemical vapor deposition process, for example.

As shown in FIG. 2B, a self-aligned etching process is carried out to form a pair of conductive spacers 220a on the sidewalls of the stacked gate structure 208. The self-aligned etching process is an anisotropic etching process, for example. Thereafter, one of the conductive spacers 220a on the sidewalls of the stacked gate structure 208 and then the gate dielectric layer 218 not covered by the conductive spacer 220a are removed to form the asymmetrical sidewall structure. It should be noted that the retained conductive spacer 220a is disposed on the same side as a subsequently formed source region. The conductive spacer 220a is subsequently used as a select gate.

Thereafter, a p-type deep doped region 222 is formed in the n-type well 204 on one side of the stacked gate structure 208. The p-type deep doped region 222 is adjacent to the p-type shallow doped region 206. The p-type deep doped region 222 is formed, for example, by performing an ion implantation. It should be noted that the p-type deep doped region 222 is disposed on the same side as a subsequently formed drain region.

As shown in FIG. 2C, an n-type source region 224a and an n-type drain region 224b are formed on each side of the select gate 220a and the stacked gate structure 208. The n-type source region 224a is formed across the p-type shallow doped region 206 and extend to the n-type substrate 200 on one side of the select gate 220a. For a NOR type flash memory cell array, every pair of neighboring stacked gate structures 208 uses a common n-type source region 224a. The n-type drain region 224b is formed in the p-type deep doped region 222 on another side of the stacked gate structure 208. The n-type source region 224a and the n-type drain region 224b are formed in an ion implantation, for example.

A dielectric layer 226 is formed over the substrate 200 to cover the stacked gate structure 208 and the substrate 200. Thereafter, a contact opening 228 is formed in the dielectric layer 226 to expose a portion of the drain region 224b and the p-type deep doped region 222. The dielectric layer 226 is fabricated using silicon oxide, silicon oxynitride or other suitable material. The method of forming the dielectric layer 226 includes depositing a dielectric material layer over the substrate 200 and then performing a photolithographic and etching process to define the contact opening 228.

After removing the drain region 224b and a portion of the deep doped region 222 inside the contact opening 228, a conductive material is deposited into the contact opening 228 to form a conductive plug 230. It should be noted that the conductive plug 230 shorts the drain region 224b and the deep doped region 222 together. The conductive plug 230 is fabricated using tungsten or other suitable conductive material, for example. The method of forming the conductive plug 230 includes, for example, depositing a conductive material into the contact opening 228 and performing a chemical-mechanical polishing to remove excess material outside the opening 228.

Because a select gate is deployed in the flash memory cell of the present invention, problems due to device leakage or over-programming in a conventional programming operation are effectively eliminated. Furthermore, the processes for forming the memory cell according to the present invention are compatible with the convention fabricating method. Hence, there is no need to purchase special equipment.

Figure 3:
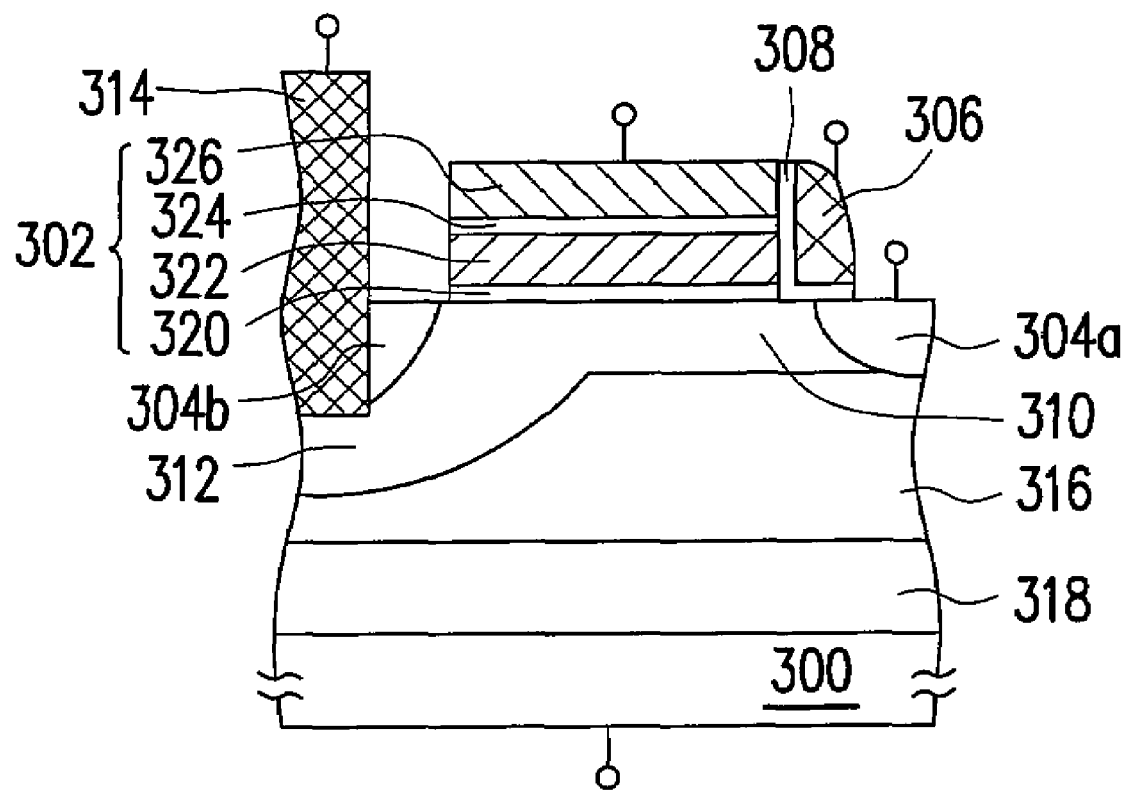
FIG. 3 is a schematic cross-sectional view of a flash memory cell according to one preferred embodiment of the present invention.

FIG. 3 is a schematic cross-sectional view of a flash memory cell according to one preferred embodiment of the present invention. As shown in FIG. 3, the flash memory cell mainly includes a substrate 300, a stacked gate structure 302, an n-type source region 304a, an n-type drain region 304b, a select gate 306, a gate dielectric layer 308, a p-type shallow doped region 310, a p-type deep doped region 312, a conductive plug 314, an n-type well 316 and a p-type deep well 318.

The p-type deep well 318 is disposed in the substrate 300 and the n-type well 316 is disposed within the p-type deep well 318. The stacked gate structure 302 is disposed on the substrate 300. The stacked gate structure 302 includes a tunneling layer 320, a floating gate 322, an inter-gate dielectric layer 324 and a control gate 326 sequentially stacked over the substrate 300. The floating gate 322 and the control gate 326 are fabricated from doped polysilicon, for example. In addition, the n-type source region 304a and the n-type drain region 304b are disposed in the substrate 300 on each side of the stacked gate structure 302.

Furthermore, the select gate 306 is disposed between the stacked gate structure 302 and the n-type source region 304a such that the select gate 306 backs on one of the sidewalls of the stacked gate structure 302 above a portion of the substrate 300. The select gate 306 is fabricated from doped polysilicon, for example. The gate dielectric layer 308 is disposed between the select gate 306 and the stacked gate structure 302 and between the select gate 306 and the substrate 300. The gate dielectric layer 308 is a silicon oxide layer, for example.

The p-type shallow doped region 310 is disposed in the n-type well 316 underneath the stacked gate structure 302 and the select gate 306, wherein the n-type source region 304a is disposed in the p-type shallow doped region 310. In addition, the p-type deep doped region 312 is disposed in the n-type well 316 on one side of the stacked gate structure 302 but adjacent to the p-type shallow doped region 310, wherein the n-type drain region 304b is disposed in the p-type deep doped region 312. The conductive plug 314 is disposed in the substrate 300 such that the conductive plug 314 extends downward passing through the n-type drain region 304b and ends up with a portion buried in the p-type deep doped region 312. Hence, the drain region 304b and the deep doped region 312 are shorted together through the conductive plug 314.

Because of the select gate inside the flash memory cell of the present invention, problems due to device leakage or over-programming in a conventional programming operation are effectively eliminated. Furthermore, programming a flash memory cell will no longer affect a neighboring flash memory cell. Hence, overall reliability of the memory device is improved. In addition, each flash memory cell can be used as a multi-bit storage cell.

Figure 4:
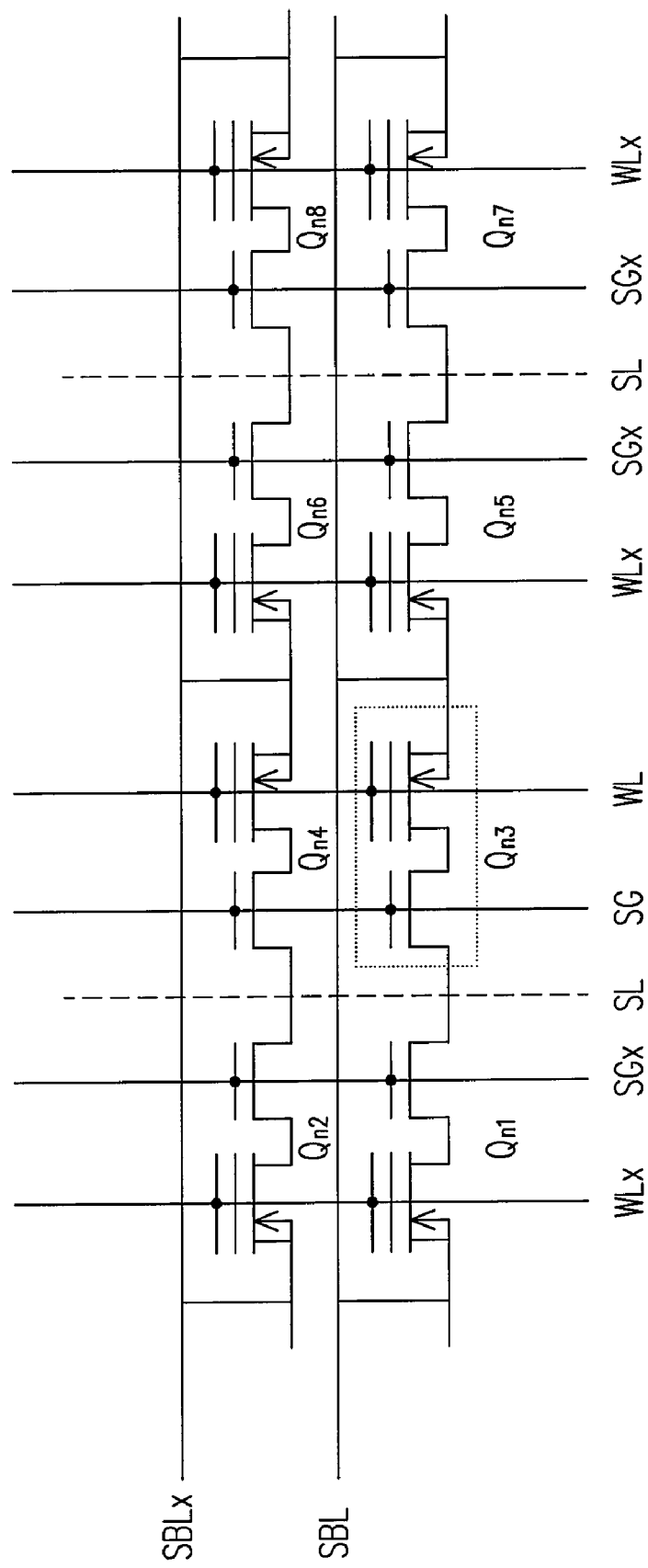
FIG. 4 is an equivalent circuit diagram of a NOR type memory array according the present invention.

In the following, the operating modes of a NOR type flash memory cell array in programming, erasing and reading are described. FIG. 4 is an equivalent circuit diagram of a NOR type flash memory cell array. Table 1 below lists out all the actual bias voltages used in operating the flash memory cell array. However, the values in Table 1 is used as an illustration only and should by no means limit the scope of the present invention.

As shown in FIG. 4, a plurality of memory cells $Q_{n1} \sim Q_{n8}$ are aligned to form a 4*2 array. In FIG. 4, the selected word lines WL and the non-selected word lines $WL_x$ linking the control gate of the vertical memory cells are also shown. In the present embodiment, the selected word lines WL connect the control gates in the same memory cell column such as the memory cells $Q_{n3}$ and $Q_{n4}$. The non-selected word lines $WL_x$ connect the control gates in the same memory cell column such as $Q_{n1}$ and $Q_{n2}$ (or memory cells $Q_{n5}$ and $Q_{n6}$, $Q_{n7}$ and $Q_{n8}$). Similarly, the selected select gate line SG and the non-selected select gate lines $SG_x$ connect the same memory cell column. In the present embodiment, the selected select gate line SG connects the select gate of the memory cells in the same column such as $Q_{n3}$ and $Q_{n4}$. The non-selected gate lines $SG_x$ connect the select gates in the same memory cell column such as $Q_{n1}$ and $Q_{n2}$ (or memory cells $Q_{n5}$ and $Q_{n6}$, $Q_{n7}$ and $Q_{n8}$). The source line SL connects the source region in the same memory cell column, and the pair of neighboring memory cells in the same row uses the same source line SL. In the present embodiment, the source line SL connects the source region of the memory cells in the same column such as $Q_{n3}$ and $Q_{n4}$. Furthermore, the pair of neighboring memory cells in the same row such as $Q_{n1}$ and $Q_{n3}$ uses the same source line SL. The selected bit lines SBL and the non-selected bit lines $SBL_x$ connect the drain region in the same memory cell column. In the present embodiment, the select bit line SBL connects the drain of the memory cells in the same memory cell row such as $Qn_1$, $Qn_3$, $Qn_5$ and $Qn_7$. Similarly, the non-selected bit line $SBL_x$ connects the drain of the memory cells in the same memory cell row such as $Qn_2$, $Qn_4$, $Qn_6$ and $Qn_8$.

TABLE 1

|  | Programming | Erasing | Reading |
|---|---|---|---|
| Selected word line WL | −10 V | 10 V | 3.3 V |
| Non-selected word line $WL_x$ | 0 V | −6 V | 0 V |
| Selected bit line SBL | 6 V | Floating (F) | 0 V |
| Non-selected bit line $SBL_x$ | 0 V | Floating (F) | 0 V |
| Source line SL | 6 V | −6 V | 1.65 V |
| Selected select gate line SG | 0 V | 0 V | 3.3 V |
| Non-selected select gate line $SG_x$ | 0 V | 0 V | 0 V |
| Deep p-type well (318) | 0 V | −6 V | 0 V |

As shown in FIGS. 3 and 4 and Table 1, to program data into a flash memory cell (for example, $Q_{n3}$) a positive voltage is applied to the source region 304a and the drain region 304b and a negative voltage is applied to the control gate 326. Both the select gate 306 and the deep p-type well 318 are set to 0V so that electric charges are induced to leave the floating gate 322 through F-N tunneling effect. During the programming operation, the voltage of the control gate, the bit line and the select gate of neighboring memory cells are set to 0V. In one preferred embodiment, the positive voltage is a voltage between 1 to 20V and the negative voltage is a voltage between −1 to −20V. In the present embodiment, the positive voltage is 6V while the negative voltage is −10V.

To erase data from a flash memory (for example, $Q_{n3}$), a positive voltage is applied to the control gate 326 and a negative voltage is applied to the source region 304a and the deep p-type well 318. The select gate 306 is set to 0V and the drain region 304b is set to a floating state so that electric charges are induced to enter the floating gate 322 through F-N tunneling effect. During the erasing operation, the same negative voltage applied to the source region 304a and the deep p-type well 318 is applied to the control gate of neighboring memory cells while the bit line is set to a floating state and the select gate is set to 0V. In one preferred embodiment, the positive voltage is a voltage between 1 to 20V and the negative voltage is a voltage between −1 to −20V. In the present embodiment, the positive voltage is 10V while the negative voltage is −6V.

To read data from a flash memory (for example, $Q_{n3}$), a first positive voltage is applied to the source region 304a and a second positive voltage is applied to the control gate 326 and the select gate 306. The drain region 304b and the deep p-type well 318 are set to 0V. During the reading operation, the control gate, the bit line and select gate of neighboring memory cells is set to 0V. In one preferred embodiment, the first positive voltage is a voltage between 1 to 15V and the second positive voltage is a voltage between 1 to 15V. In the present invention, the first positive voltage is 1.65 and the second positive voltage is 3.3V.

In the presence of a select gate inside the flash memory cell, the unexpected programming on non-selected cells in a programming operation will be alleviated. This is mainly because the voltage of the common source region is blocked by the select gate to avoid electrons in the floating gates being drain out. In other words, reliability of the memory device is improved.

Furthermore, for a single flash memory cell having a select gate between the control gate and the source region, device leakage during a programming operation is no longer a serious problem. Moreover, with the problem of over-programming a flash memory resolved, the present invention also eliminates read-out errors.

In addition, a programmed memory cell can have a larger threshold voltage window because a select gate is disposed between the control gate and the source region. As a result, the flash memory cell of the present invention can also be modified to serve as a multi-bit storage cell.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating flash memory cells, comprising the steps of:
   providing a first conductive type substrate;
   forming a second conductive type deep well in the first conductive type substrate;
   forming a first conductive type well in the second conductive type deep well;
   forming a second conductive type shallow doped region in the first conductive type well, wherein the shallow doped region is adjacent to the substrate surface;
   forming two stacked gate structures over the substrate, wherein each stacked gate structure comprises a tunneling layer, a floating gate, an inter-gate dielectric layer and a control gate sequentially stacked over the substrate;
   forming a gate dielectric layer between the stacked gate structures and the substrate surface;
   forming a select gate on a sidewall of each stacked gate structure;
   forming a second conductive type deep doped region in the substrate on the other side of each stacked gate structure, wherein the deep doped regions and the shallow doped region are adjacent to each other;
   forming a common source region in the substrate between the two select gates and a drain region in each deep doped region on one side of the stacked gate structures;
   forming a dielectric layer over the substrate to cover the stacked gate structures and the substrate, wherein the dielectric layer has a contact opening that exposes a portion of the drain regions and the deep doped regions; and
   forming a conductive plug inside the contact opening.

2. The method according to claim 1, wherein the step of forming the select gate on the sidewall of the stacked gate structure comprises:

forming a conductive material layer over the gate dielectric layer;

performing a self-aligned etching process to form a pair of conductive spacers on the sidewalls of the stacked gate structure; and removing one of the conductive spacers from the sidewalls of the stacked gate structure.

3. The method according to claim 2, wherein the material constituting the conductive material layer comprises doped polysilicon.

4. The method according to claim 1, wherein the conductive plug shorts the drain region and the deep doped region together.

5. The method according to claim 1, wherein the source region and the drain region are the first conductive type.

6. The method according to claim 1, wherein the first conductive type is n-type and the second conductive type is p-type.

7. The method according to claim 1, further comprising:

forming a source line to connect the source region; and forming a bit line to connect the drain region, wherein the select gate is formed between the source region and the stacked gate structure.

* * * * *